(12) United States Patent
Shriner et al.

(10) Patent No.: US 10,923,406 B2
(45) Date of Patent: Feb. 16, 2021

(54) SPECTRAL REFLECTOMETRY WINDOW HEATER

(71) Applicant: Texas Instruments Incorporated, Dallas, TX (US)

(72) Inventors: John Christopher Shriner, Allen, TX (US); Maja Imamovic, Rowlett, TX (US); Kevin Paul Wiederhold, Wylie, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/712,234

(22) Filed: Dec. 12, 2019

(65) Prior Publication Data
US 2020/0118894 A1  Apr. 16, 2020

Related U.S. Application Data

(63) Continuation of application No. 13/553,052, filed on Jul. 19, 2012, now Pat. No. 10,541,183.

(51) Int. Cl.
| | | |
|---|---|---|
| *H01L 21/00* | (2006.01) | |
| *H01L 21/66* | (2006.01) | |
| *H01L 21/67* | (2006.01) | |
| *H01J 37/32* | (2006.01) | |

(52) U.S. Cl.
CPC ........ *H01L 22/26* (2013.01); *H01J 37/32082* (2013.01); *H01J 37/32522* (2013.01); *H01L 21/6715* (2013.01); *H01L 21/67069* (2013.01); *H01L 21/67253* (2013.01); *H01L 2924/0002* (2013.01)

(58) Field of Classification Search
CPC ............... H01L 22/26; H01L 21/67069; H01L 21/6715; H01L 2924/0002; H01L 21/67253; H01J 37/32082; H01J 37/32522
See application file for complete search history.

(56) References Cited

U.S. PATENT DOCUMENTS

| | | |
|---|---|---|
| 4,412,885 A | 11/1983 | Wang et al. |
| 5,000,113 A | 3/1991 | Wang et al. |
| 5,290,383 A | 3/1994 | Koshimizu |
| 5,792,672 A | 8/1998 | Chan et al. |
| 5,900,177 A | 5/1999 | Lecouras et al. |
| 6,005,231 A | 12/1999 | Lanovich et al. |
| 6,052,176 A | 4/2000 | Ni et al. |
| 6,187,689 B1 | 12/2001 | Tabara |
| 6,508,911 B1 | 1/2003 | Han et al. |
| 6,808,747 B1 | 10/2004 | Shih et al. |
| 6,815,364 B2 | 11/2004 | Stojakovic et al. |

(Continued)

*Primary Examiner* — Ismail A Muse
(74) *Attorney, Agent, or Firm* — Ebby Abraham; Charles A. Brill; Frank D. Cimino

(57) ABSTRACT

A plasma processing tool for fabricating a semiconductor device on a semiconductor wafer includes an optical window disposed on a plasma chamber, remotely from a plasma region. The window is thermally connected to an electrical heater element capable of maintaining the window at a temperature of at least 30° C. A heater controller provides electrical power to the heater element. During operation of the plasma processing tool, the heater controller provides power to the heater element so as to maintain the window at a temperature of at least 30° C. during at least a portion of a plasma process step in which by-products are produced in the plasma chamber.

20 Claims, 3 Drawing Sheets

(56) References Cited

U.S. PATENT DOCUMENTS

| | | |
|---|---|---|
| 6,835,275 B1 | 12/2004 | Grimbergen et al. |
| 10,541,183 B2 * | 1/2020 | Shriner ............. H01L 21/67069 |
| 2003/0070620 A1 | 4/2003 | Cooperberg et al. |
| 2003/0090667 A1 | 5/2003 | Kaufmann |
| 2004/0037913 A1 | 2/2004 | Gellert et al. |
| 2005/0182150 A1 | 8/2005 | Bamborough et al. |
| 2007/0224364 A1 | 9/2007 | Matsuda et al. |
| 2008/0047655 A1 | 2/2008 | Kargiannis et al. |
| 2010/0079425 A1 | 4/2010 | Yamazaki et al. |
| 2010/0288117 A1 | 11/2010 | Jones et al. |
| 2012/0017905 A1 | 1/2012 | Sata et al. |
| 2012/0312973 A1 | 12/2012 | D'Costa et al. |

* cited by examiner

SPECTRAL REFLECTOMETRY WINDOW HEATER

CROSS-REFERENCE TO RELATED APPLICATIONS

This continuation application claims priority to U.S. patent application Ser. No. 13/553,052, filed Jul. 19, 2012, which is hereby fully incorporated herein by reference for all purposes.

FIELD OF THE INVENTION

This invention relates to the field of semiconductor fabrication equipment. More particularly, this invention relates to semiconductor plasma processing equipment.

BACKGROUND OF THE INVENTION

Fabrication of semiconductor devices, including integrated circuits, may include one or more steps of etching a silicon-containing material or an aluminum-containing material, or forming a layer of material, on a semiconductor wafer using a plasma in a plasma processing tool. The process of etching or forming a layer on the semiconductor device may generate by-products which deposit inside a plasma chamber of the plasma processing tool performing the silicon etch process. The by-products may deposit on an optical window used, for example, for endpoint detection of the plasma process step. Buildup of by-products on the window may undesirably limit accuracy of the optical data obtained through the window, and/or may undesirably necessitate frequent cleaning of the window, reducing availability of the plasma processing tool.

SUMMARY OF THE INVENTION

A plasma processing tool, such as a reactive ion etch (ME) tool, a plasma enhanced chemical vapor deposition (PECVD) tool or a sputtering tool, may include an optical window disposed on a plasma chamber of the tool, remotely from a plasma region of the plasma chamber. The window is thermally connected to an electrical heater element capable of maintaining the window at a temperature of at least 30° C. A heater controller provides electrical power to the heater element. During operation of the plasma processing tool, the heater controller provides power to the heater element so as to maintain the window at least 30° C. during at least a portion of a plasma processing step in which material is etched or a material layer is formed on a semiconductor device in the plasma chamber.

DETAILED DESCRIPTION OF EXAMPLE EMBODIMENTS

A plasma processing tool, such as an RIE tool, a PECVD tool or a sputtering tool, may include an optical window disposed on a plasma chamber of the plasma processing tool, remotely from a plasma region of the plasma chamber. The window is thermally connected to an electrical heater element capable of maintaining the window at a temperature of at least 30° C. A heater controller provides electrical power to the heater element. During operation of the plasma processing tool, the heater controller provides power to the heater element so as to maintain the window at a temperature of at least 30° C. during at least a portion of a plasma processing step in which material is etched or a material layer is formed on a semiconductor device in the plasma chamber.

Figure 1:
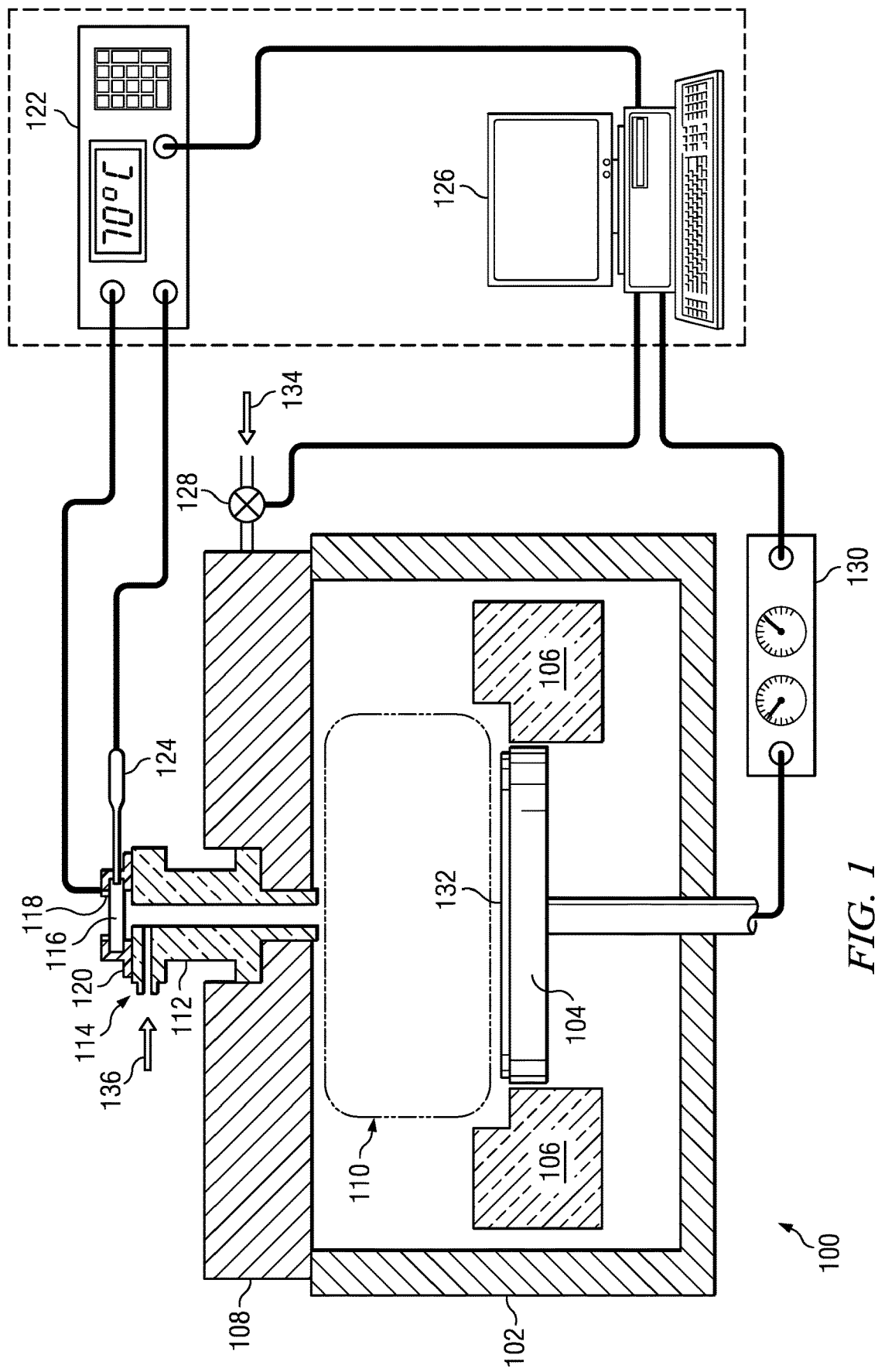
FIG. 1 depicts an RIE tool according to an embodiment.

FIG. 1 depicts a plasma processing tool according to an embodiment. The plasma processing tool 100 includes a plasma chamber 102. A wafer chuck 104 is disposed in the plasma chamber 102. An edge ring 106 is disposed in the plasma chamber 102 surrounding the wafer chuck 104; the edge ring 106 may be formed of, for example, quartz. A top plate 108 is positioned over the plasma chamber 102 so as to enclose a plasma region 110 over the wafer chuck 104.

A gas injector nozzle 112 is disposed in the top plate 108 so as to introduce gases, such as reactant gases or inert gases, into the plasma region 110. The gas injector nozzle 112 may be formed of, for example, quartz. Optionally, at least a portion of gases used in the plasma processing tool 100 may be introduced through an optional input port 114 located at an end of the gas injector nozzle 112 opposite from the plasma region 110. An optical window 116 is mounted on the gas injector nozzle 112 opposite from the plasma region 110, proximate to the input port 114 if present. An electrical heater element 118 is thermally connected to the optical window 116 so as to be capable of heating the optical window 116 to at least 30° C. The window 116 may be directly mounted to the gas injector nozzle 112 or may be mounted in a window fixture 120 which is mounted to the gas injector nozzle 112, as depicted in FIG. 1. The optical window 116 may have a homogeneous composition structure, or may have a laminar structure.

The heater element 118 is provided electrical power by a heater controller 122. The heater controller 122 may be a static power supply, or may be an adjustable power supply. An optional temperature sensor 124 may be thermally connected to the window 116 and connected to the heater controller 122 so as to provide a signal indicative of a temperature of the window 116 to the heater controller 122. The heater controller 122 may be an active temperature controller which uses the signal from the temperature sensor 124 to adjust power to the heater element 118.

The plasma processing tool 100 includes a process controller 126 which may be, for example a computer workstation or a controller customized to the plasma processing tool 100. The process controller 126 is connected to at least one valve 128 which is in turn connected to the plasma chamber 102, so as to control gases through the valve into the plasma region 110. The process controller 126 is also connected to a plasma power supply 130, such as a radio frequency (RF) power supply 103 or a microwave power supply 130, so as to control electrical power supplied to the plasma region 110. The process controller 126 may be further connected to the heater controller 122. In one version of the instant embodiment, the heater controller 122 may be contained in the process controller 126, as depicted by the phantom line enclosing the process controller 126 and the heater controller 122.

During operation of the plasma processing tool 100, a semiconductor wafer 132 is positioned in the plasma chamber 102 on the wafer chuck 104. The process controller 126 causes the at least one valve 128 to be opened to admit gases 134 into the plasma chamber 102. Gases 136, possibly a portion of the gases 134 or possibly inert gases such as helium or argon, may also be flowed through the input port 114 of the gas injector nozzle 112 into the plasma chamber 102, possibly under control of the process controller 126. In one version of the plasma processing tool 100, the at least one valve 128 may be identical with the input port 114 of the gas injector nozzle 112. The process controller 126 causes the plasma power supply 130 to provide RF or microwave power to the plasma region 110, causing a plasma to form in the plasma region 110, thereby starting a plasma process step.

In some versions of the instant embodiment in which the plasma processing tool 100 is an RIE tool, the plasma process step may be an etch step that removes silicon-containing material on the semiconductor wafer 132. Silicon-containing materials include, for example, crystalline silicon in a substrate of the semiconductor wafer 132, polycrystalline silicon material, silicon nitride and silicon dioxide. In such an etch step, the gases 134 may include, for example, reactant gases containing fluorine, chlorine and/or bromine, so that ionized reactants from the plasma region 110 are directed against a top surface of the semiconductor wafer 132 and etch exposed silicon-containing material on the semiconductor wafer 132. By-products from the etch step, including silicon-containing material, are produced from the top surface of the semiconductor wafer 132, and may deposit on an interior surface of the plasma chamber 102.

In other versions of the instant embodiment in which the plasma processing tool 100 is an RIE tool, the plasma process step may be an etch step that removes aluminum-containing material on the semiconductor wafer 132. Aluminum-containing materials include, for example, aluminum with a few percent silicon and/or a few percent copper, used as interconnect metal. In such an etch step, the gases 134 may include, for example, reactant gases containing chlorine, so that ionized reactants from the plasma region 110 are directed against the top surface of the semiconductor wafer 132 and etch exposed aluminum-containing material on the semiconductor wafer 132. By-products from the etch step, including aluminum-containing material, are produced from the top surface of the semiconductor wafer 132, and may deposit on an interior surface of the plasma chamber 102.

In some versions of the instant embodiment in which the plasma processing tool 100 is a PECVD tool, the plasma process step may be a dielectric layer formation step that forms silicon dioxide on the semiconductor wafer 132. In such a dielectric layer formation step, the gases 134 may include, for example, tetraethyl orthosilicate, also known as tetraethoxysilane or TEOS, so that silicon and oxygen reactants from the plasma region 110 are directed to the top surface of the semiconductor wafer 132 and form silicon dioxide on the semiconductor wafer 132. By-products from the dielectric layer formation step, including silicon-containing material, are produced from the plasma region 110, and may deposit on an interior surface of the plasma chamber 102.

In other versions of the instant embodiment in which the plasma processing tool 100 is a PECVD tool, the plasma process step may be a dielectric layer formation step that forms silicon nitride on the semiconductor wafer 132. In such a dielectric layer formation step, the gases 134 may include, for example, bis (tertiary-butylamino) silane (BT-BAS), so that silicon and nitrogen reactants from the plasma region 110 are directed to the top surface of the semiconductor wafer 132 and form silicon nitride on the semiconductor wafer 132. By-products from the dielectric layer formation step, including silicon-containing material, are produced from the plasma region 110, and may deposit on an interior surface of the plasma chamber 102.

In some versions of the instant embodiment in which the plasma processing tool 100 is a sputtering tool, the plasma process step may be an aluminum alloy layer formation step that forms aluminum alloy, such as aluminum with a few percent silicon and/or a few percent copper on the semiconductor wafer 132. In such an aluminum alloy layer formation step, the gases 134 may include, for example, argon, so that aluminum atoms, and possibly silicon atoms and/or copper atoms, from the plasma region 110 are directed to the top surface of the semiconductor wafer 132 and form the aluminum alloy layer on the semiconductor wafer 132. By-products from the aluminum alloy layer formation step, including aluminum-containing material, are produced from the plasma region 110, and may deposit on an interior surface of the plasma chamber 102.

During at least a portion of the plasma process, electrical power is provided from the heater controller 122 to the heater element 118 that thermally connected to the optical window 116, thereby causing a temperature of the optical window 116 to rise to at least 30° C. In one version of the instant embodiment, the heater controller 122 may provide electrical power during the entire plasma process. In one version of the instant embodiment, the heater controller 122 may provide electrical power under control by the process controller 126. In one version of the instant embodiment, the heater controller 122 may receive a signal from the temperature sensor 124 to adjust power to the heater element 118 so as to control the temperature of the optical window 116 within a desired temperature range, for example +/−1° C. Heating the optical window 116 to at least 30° C. may desirably prevent the plasma process by-products from depositing on the optical window 116, so as to allow the optical window 116 to transmit an endpoint detection signal to the semiconductor wafer 132 and transmit a reflected endpoint detection signal from the semiconductor wafer 132 to an endpoint detection apparatus (not shown). Flowing gases 136 through the input port 114 of the gas injector nozzle 112 during the plasma process may desirably assist prevention of deposition of the plasma process by-products on the optical window 116.

Figure 2:
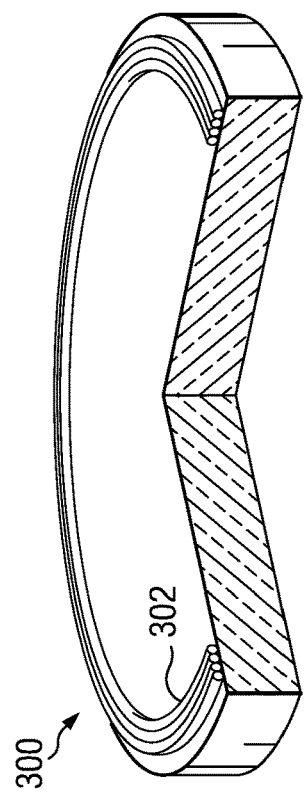
FIG. 2 through FIG. 5 are cross sections of optical windows with exemplary heater element configurations.

FIG. 2 through FIG. 5 are cross sections of optical windows with exemplary heater element configurations. Other heater element configurations are within the scope of the instant invention. Referring to FIG. 2, an optical window 200 has a circumferential groove 202 formed in a lateral side of the window 200. A heater element 204, for example nickel chromium alloy (nichrome) heater wire, is disposed in the groove 202 around at least partway around a circumference of the window 200. The heater element 204 may be held in the groove 202 by an appropriate adhesive, such as a high temperature epoxy. Disposing the heater element 204 in the groove may advantageously provide better thermal coupling between the heater element and the optical window 200 so as to minimize power provided to the heater element 204.

Figure 3:
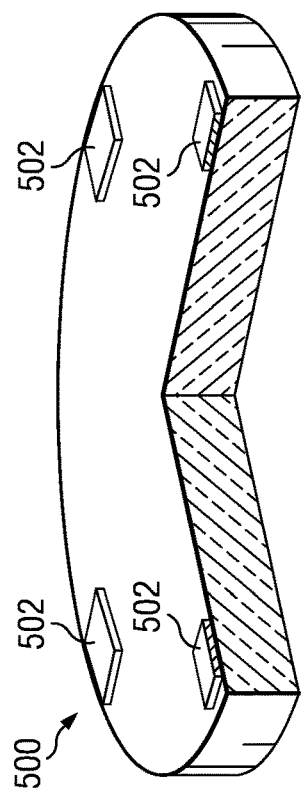

Referring to FIG. 3, an optical window 300 has a heater element 302 attached to a face of the optical window 300 proximate to a lateral edge of the optical window 300 and extending at least partway along a circumference of the lateral edge. The heater element 302 may be, for example, one or more loops of nichrome wire, as depicted in FIG. 3, or may be a flat strip of heater element material, such as a polymer including graphite particles. The heater element 302 may be attached to the face of the optical window 300 by an appropriate adhesive, such as a high temperature epoxy. Attaching the heater element 302 to a face of the optical window 300 may advantageously enable attachment of a temperature sensor at a lateral side of the optical window 300 without interfering with the heater element 302.

Figure 4:
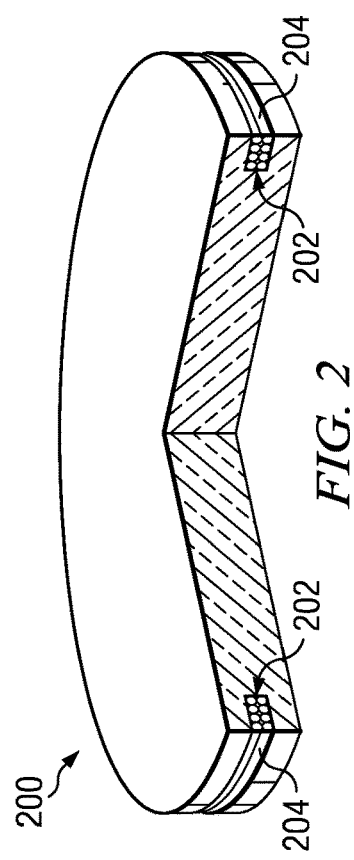

Referring to FIG. 4, an optical window 400 has a heater element 402 attached to a lateral side surface of the optical window 400 and extending at least partway along a circumference of the lateral side surface. The heater element 402 may be, for example, one or more loops of nichrome wire. The heater element 402 may be attached to the lateral side surface of the optical window 400 by an appropriate adhesive, such as a high temperature epoxy. Attaching the heater element 402 to the lateral side surface of the optical window 400 so as not to obstruct optical transmission through faces of the optical window 400 may advantageously enable a smaller window 400 to be used.

Figure 5:
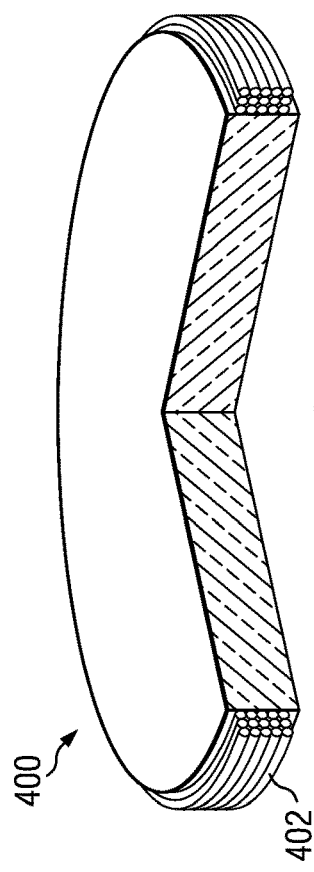

Referring to FIG. 5, an optical window 500 has one or more discrete heater elements 502 attached to a face of the optical window 500 proximate to a lateral edge of the optical window 300 and distributed at least partway along a circumference of the lateral edge. The heater elements 502 may be, for example, a sealed heater cartridge, or a common discrete resistor. The heater elements 502 may be attached to the face of the optical window 500 by an appropriate adhesive, such as a high temperature epoxy. Using discrete heater elements 502 may advantageously reduce an assembly cost of the optical window 500.

Figure 6:
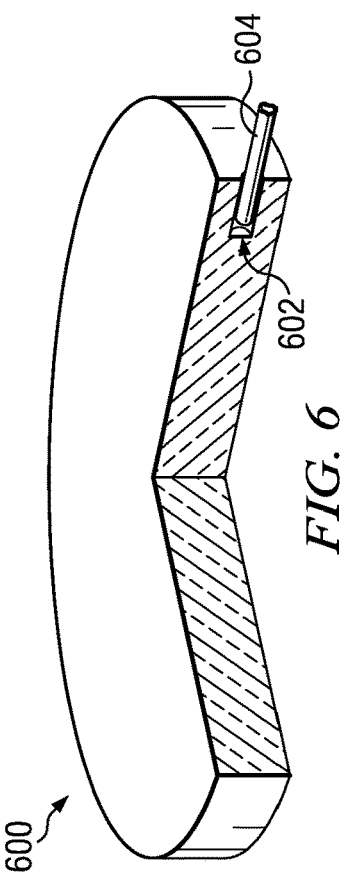
FIG. 6 through FIG. 8 are cross sections of optical windows with exemplary temperature sensor configurations.
Figure 7:
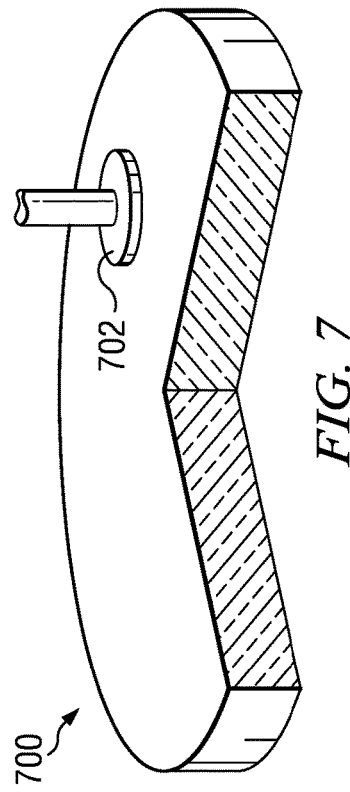
Figure 8:
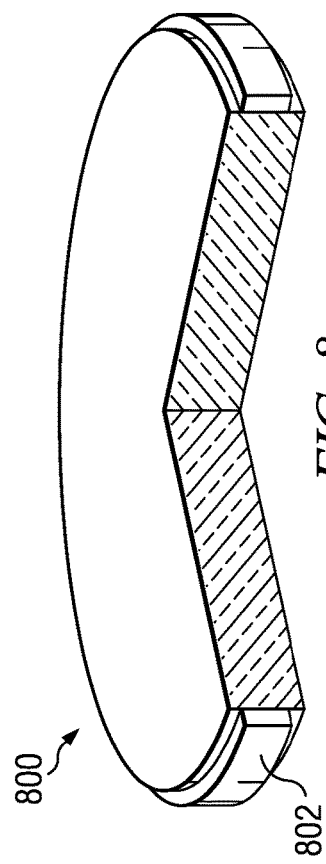

FIG. 6 through FIG. 8 are cross sections of optical windows with exemplary temperature sensor configurations. Other temperature sensor configurations are within the scope of the instant invention. Referring to FIG. 6, an optical window 600 has a cavity 602 formed in a lateral side of the optical window 600. A temperature sensor 604, for example a thermistor or a thermocouple junction, is disposed in the cavity 602. The temperature sensor 604 may be held in the cavity 602 by an appropriate adhesive, such as a high temperature epoxy. Holding the temperature sensor 604 in the cavity 602 with an adhesive may advantageously provide thermal coupling between the optical window 600 and the temperature sensor 604 so as to desirably enable the temperature sensor 604 to provide a more accurate indication of the temperature of the optical window 600.

Referring to FIG. 7, an optical window 700 has a temperature sensor 702 attached to a face of the optical window 700, proximate to a lateral side of the optical window 700. The temperature sensor 702 may be, for example, a thermistor or thermocouple probe. The temperature sensor 702 may be attached to the optical window 700 by an appropriate adhesive, such as a high temperature epoxy. Attaching the temperature sensor 702 to the face of the optical window 700 may advantageously enable attachment of a heater element at a lateral side of the optical window 700 without interfering with the temperature sensor 702. Attaching the temperature sensor 702 to the face of the optical window 700 may advantageously reduce an assembly cost of the optical window 700.

Referring to FIG. 8, an optical window 800 has a distributed temperature sensor 802 attached to a lateral side surface of the optical window 800, extending at least partway around a circumference of the lateral side surface. The temperature sensor 802 may be, for example, a length of resistive wire with a known temperature coefficient of resistance. The temperature sensor 802 may be attached to the optical window 800 by an appropriate adhesive, such as a high temperature epoxy. Using a distributed temperature sensor 802 may advantageously provide a more accurate indicator of an average temperature of the entire optical window 800. Attaching the temperature sensor 802 to the lateral side surface of the optical window 800 may advantageously enable attachment of a heater element to a face of the optical window 800 without interfering with the temperature sensor 802.

Figure 9:
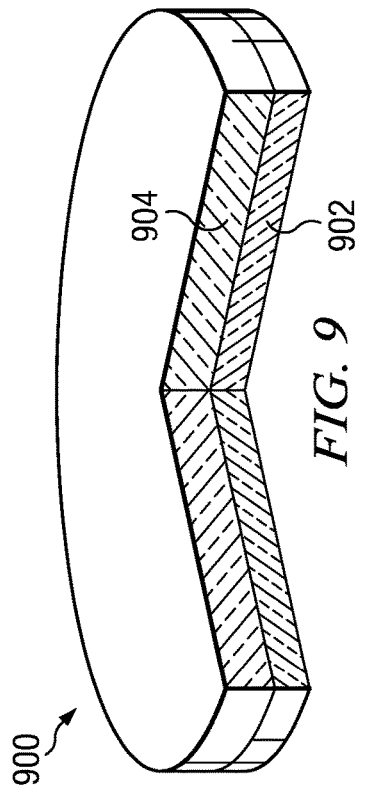
FIG. 9 through FIG. 11 are cross sections of optical windows having exemplary laminar structures.
Figure 10:
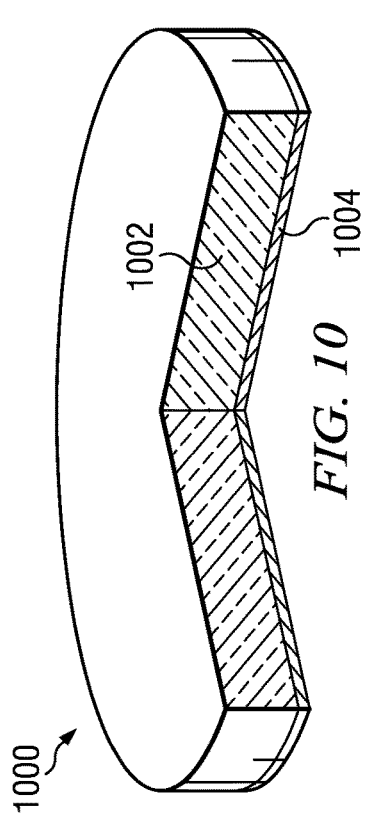
Figure 11:
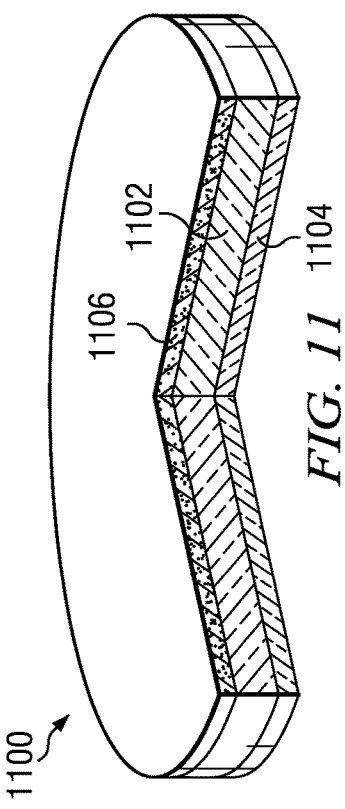

FIG. 9 through FIG. 11 are cross sections of optical windows having exemplary laminar structures. Other window structures are within the scope of the instant invention. Referring to FIG. 9, an optical window 900 has a dual laminar structure with a first layer 902 which is exposed to an interior of a plasma chamber of a plasma processing tool as described in reference to FIG. 1, and a second layer 904 which is exposed to an exterior of the plasma chamber. The first layer 902 may be formed of a material which is resistant to chemical attack by reactants and by-products from a plasma process step performed in the plasma chamber. The first layer 902 may be formed of, for example, sapphire. The second layer 904 may be formed of a material which provides a desired durability for attaching heater elements and mounting on a gas injector nozzle, as described in reference to FIG. 1. The second layer 904 may be formed of, for example, quartz, borosilicate glass, or polycarbonate. The first layer 902 and the second layer 904 may be attached to each other, for example, using an appropriate optical adhesive, such as a one-part ultraviolet-curing optical cement. Forming the window 900 with a dual laminar structure may provide a desired balance between chemical resistance and durability.

Referring to FIG. 10, an optical window 1000 has a coated laminar structure. The optical window 1000 has a body section 1002 and a coating layer 1004 on the body section 1002. The coating layer 1004 is exposed to the interior of the plasma chamber. The coating layer 1004 may be formed of a coating material which is resistant to chemical attack by reactants and by-products from the plasma process step. The coating layer 1004 may be formed of, for example, an aluminum oxide coating or a thin film diamond coating. The body section 1002 may be formed of a material which provides a desired durability for attaching heater elements and mounting on a gas injector nozzle, for example, quartz, borosilicate glass, or polycarbonate. Forming the body section 1002 of polycarbonate may be particularly advantageous for embodiments which include grooves or cavities in lateral sides of the optical window 1000, such as described in reference to FIG. 2 and FIG. 6.

Referring to FIG. 11, an optical window 1100 has a triple layer laminar structure with a core section 1102, a first layer 1104 which is exposed to the interior of the plasma chamber, and a second layer 1106 which is exposed to the exterior of the plasma chamber. The core section 1102 may be formed of, for example, a material which provides a desired durability for attaching heater elements and mounting on a gas injector nozzle, for example, quartz, borosilicate glass, or polycarbonate. The first layer 1104 may be formed of a material, for example sapphire, which is resistant to chemical attack by reactants and by-products from the plasma process step. The second layer 1106 may be formed of a material such as aluminum oxide or aluminum oxynitride which provides a hard surface which resist scratches.

Any of the windows described in reference to FIG. 2 through FIG. 11 may have an optical coating on a surface exposed to the exterior of the plasma chamber, so as to improve optical transmission through the window. Similarly, any of the windows may have an optical coating on a surface exposed to the interior of the plasma chamber, so as to improve optical transmission through the window. An optical coating on the surface exposed to the interior of the etch chamber may preferably be resistant to chemical attack by reactants and by-products from the plasma process step.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising:
   positioning a semiconductor wafer in a plasma chamber of a plasma processing tool;
   opening at least one valve to admit gases into the plasma chamber;
   providing power to a plasma region of the plasma chamber to form a plasma in the plasma region, the plasma region being located over the semiconductor wafer;
   performing a plasma process step while the semiconductor wafer is disposed below the plasma region; and
   providing electrical power from a heater controller to a heater element during at least a portion of the plasma process step, the heater controller being connected to a temperature sensor and the heater element being thermally connected to a laminar optical window mounted on a gas injector nozzle,
   controlling, by a process controller, the power provided by a plasma power supply to the plasma region, wherein the process controller is connected to the heater controller, the plasma power supply, and the at least one valve;
   wherein the laminar optical window includes a first surface, a second surface, a lateral side formed between the first surface and the second surface, and a cavity holding the temperature sensor,
   wherein the heater element is disposed in the lateral side of the laminar optical window.

2. The process of claim 1, wherein the plasma processing tool is a sputtering tool.

3. The process of claim 1, wherein the plasma process step is forming an aluminum alloy layer on the semiconductor wafer.

4. The process of claim 1, wherein the gases comprise argon.

5. The process of claim 1, further comprising controlling, by the process controller, the at least one valve opening.

6. The process of claim 1, wherein a temperature sensor is thermally connected to the laminar optical window and is connected to the heater controller so that the temperature sensor provides a signal indicative of a temperature of the laminar optical window to the heater controller.

7. A plasma processing tool for forming an integrated circuit, comprising:
   a plasma chamber in the plasma processing tool, the plasma chamber containing a plasma region;
   a plasma power supply connected to the plasma chamber, configured to provide electrical power to the plasma region;
   at least one valve connected to the plasma chamber, configured to provide gases to the plasma region;
   a wafer chuck disposed in the plasma chamber under the plasma region;
   a top plate positioned over the plasma chamber over the plasma region;
   a gas injector nozzle disposed in the top plate;
   a laminar optical window mounted on the gas injector nozzle opposite from the plasma region, the laminar optical window further including a first surface, a second surface, a lateral side formed between the first surface and the second surface, and a cavity holding a temperature sensor;
   an electrical heater element thermally connected to the laminar optical window; and
   a heater controller connected to the heater element and the temperature sensor; and
   a process controller connected to the heater controller, the plasma power supply, and the at least one valve, wherein the process controller is configured to control the electrical power provided by the plasma power supply to the plasma region.

8. The plasma processing tool of claim 7, wherein the plasma processing tool is a sputtering tool.

9. The plasma processing tool of claim 7, wherein the plasma processing tool configured to form an aluminum alloy layer on a semiconductor wafer.

10. The plasma processing tool of claim 7, wherein the gases comprise argon.

11. The plasma processing tool of claim 7, wherein the heater controller is configured to provide electrical power to the heater element under control by the process controller.

12. The plasma processing tool of claim 7, wherein the process controller is configured to control the provided gas by the at least one valve to the plasma region.

13. The plasma processing tool of claim 12, wherein the gas injector nozzle includes an input port for admitting gases located at an end of the gas injector nozzle opposite from the plasma region.

14. A plasma processing tool for forming an integrated circuit, comprising:
   a plasma chamber in the plasma processing tool, the plasma chamber containing a plasma region;
   a plasma power supply connected to the plasma chamber, configured to provide electrical power to the plasma region;
   at least one valve connected to the plasma chamber, configured to provide gases to the plasma region;
   a wafer chuck disposed in the plasma chamber under the plasma region;
   a top plate positioned over the plasma chamber over the plasma region;
   a gas injector nozzle disposed in the top plate;
   a laminar optical window mounted on the gas injector nozzle opposite from the plasma region;
   an electrical heater element thermally connected to the laminar optical window;
   a heater controller connected to the heater element; and
   a process controller connected to the heater controller, the plasma power supply, and the at least one valve, wherein the process controller is configured to control the electrical power provided by the plasma power supply to the plasma region,
   wherein a temperature sensor is thermally connected to the laminar optical window and is connected to the heater controller, the temperature sensor being configured to provide a signal indicative of a temperature of the laminar optical window to the heater controller, and wherein the laminar optical window includes a first surface, a second surface, a lateral side formed between the first surface and the second surface, and a cavity holding the temperature sensor.

15. The plasma processing tool of claim 7, wherein the gas injector nozzle includes an input port for admitting gases located at an end of the gas injector nozzle opposite from the plasma region.

16. The plasma processing tool of claim 14, wherein the plasma processing tool is a sputtering tool.

17. The plasma processing tool of claim 14, wherein the plasma processing tool configured to form an aluminum alloy layer on a semiconductor wafer.

18. The plasma processing tool of claim 14, wherein the gases comprises argon.

19. The process of claim 1, wherein the heater element is a nickel chromium alloy heater wire.

20. The process of claim 1, wherein the temperature sensor is a resistive wire.

\* \* \* \* \*